US012701721B2

(12) United States Patent
Park et al.

(10) Patent No.: US 12,701,721 B2
(45) Date of Patent: Aug. 4, 2026

(54) SEMICONDUCTOR PACKAGE

(71) Applicant: Samsung Electronics Co., Ltd.,
Suwon-si (KR)

(72) Inventors: Sang-Sick Park, Suwon-si (KR);
Un-Byoung Kang, Suwon-si (KR);
Min Soo Kim, Suwon-si (KR); **Seon
Gyo Kim**, Suwon-si (KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 481 days.

(21) Appl. No.: 18/337,113

(22) Filed: Jun. 19, 2023

(65) Prior Publication Data

US 2024/0162184 A1 May 16, 2024

(30) Foreign Application Priority Data

Nov. 14, 2022 (KR) ......................... 10-2022-0151456
Jan. 9, 2023 (KR) ......................... 10-2023-0002711

(51) Int. Cl.
*H10B 80/00* (2023.01)
*H10W 90/00* (2026.01)
(Continued)

(52) U.S. Cl.
CPC ............ *H10B 80/00* (2023.02); *H10W 90/00*
(2026.01); *H10W 72/072* (2026.01); *H10W
72/07254* (2026.01); *H10W 72/073* (2026.01);
*H10W 72/07332* (2026.01); *H10W 72/07338*
(2026.01); *H10W 72/07352* (2026.01); *H10W
72/07354* (2026.01); *H10W 72/241* (2026.01);
*H10W 72/247* (2026.01); *H10W 72/252*
(2026.01); *H10W 72/327* (2026.01); *H10W*

*72/347* (2026.01); *H10W 72/354* (2026.01);
*H10W 72/357* (2026.01); *H10W 72/877*
(2026.01);
(Continued)

(58) Field of Classification Search
None
See application file for complete search history.

(56) References Cited

U.S. PATENT DOCUMENTS 7,087,458 B2    8/2006   Wang et al.
8,975,177 B2    3/2015   Sasagawa
(Continued)

FOREIGN PATENT DOCUMENTS

KR        20110048733 A        5/2011

*Primary Examiner* — Long Pham
(74) *Attorney, Agent, or Firm* — Wolf, Greenfield &
Sacks, P.C.

(57) ABSTRACT

A semiconductor package includes a first structure, a first
semiconductor chip on the first structure, a first conductive
pad on the first structure between the first structure and the
first semiconductor chip, a second conductive pad on a lower
surface of the first semiconductor chip and vertically over-
lapping the first conductive pad, a bump connecting the first
conductive pad and the second conductive pad, a first
adhesive layer surrounding at least a part of side walls of the
bump and side walls of the first conductive pad, and a second
adhesive layer surrounding at least a part of the side walls of
the bump and side walls of the second conductive pad, the
second adhesive layer including a material different from the
first adhesive layer, wherein a horizontal width of the first
adhesive layer is smaller than a horizontal width of the
second adhesive layer.

20 Claims, 12 Drawing Sheets

(51) Int. Cl.

| | |
|---|---|
| *H10W 72/00* | (2026.01) |
| *H10W 72/20* | (2026.01) |
| *H10W 72/30* | (2026.01) |
| *H10W 72/90* | (2026.01) |
| *H10W 74/15* | (2026.01) |
| *H10W 90/20* | (2026.01) |
| *H10W 90/22* | (2026.01) |
| *H10W 90/26* | (2026.01) |
| *H10W 99/00* | (2026.01) |

(52) U.S. Cl.

CPC ...... *H10W 72/9415* (2026.01); *H10W 72/942* (2026.01); *H10W 72/944* (2026.01); *H10W 74/15* (2026.01); *H10W 90/22* (2026.01); *H10W 90/26* (2026.01); *H10W 90/297* (2026.01); *H10W 90/722* (2026.01); *H10W 90/724* (2026.01); *H10W 90/732* (2026.01); *H10W 90/734* (2026.01); *H10W 99/00* (2026.01)

(56)  References Cited

U.S. PATENT DOCUMENTS

| | | | | |
|---|---|---|---|---|
| 9,984,993 | B2 * | 5/2018 | Shu | H10W 70/68 |
| 10,128,226 | B2 | 11/2018 | Lin et al. | |
| 10,342,128 | B2 | 7/2019 | Shah et al. | |
| 11,088,091 | B2 * | 8/2021 | Lee | H10W 42/121 |
| 11,862,596 | B2 * | 1/2024 | Kim | H10W 70/09 |
| 2015/0072477 | A1 | 3/2015 | Matsumura et al. | |
| 2017/0033075 | A1 * | 2/2017 | Shu | H10W 70/68 |

* cited by examiner

DR2
DR1

DR2

DR1

SEMICONDUCTOR PACKAGE

This application claims priority under 35 U.S.C. 119 from Korean Patent Application No. 10-2022-0151456 filed on Nov. 14, 2022 and Korean Patent Application No. 10-2023-0002711 filed on Jan. 9, 2023 in the Korean Intellectual Property Office, the contents of which are herein incorporated by reference in their entireties.

FIELD

The present disclosure relates to a semiconductor package.

BACKGROUND

In recent years, high-performance semiconductor packages have been developed. For example, the semiconductor package electrically connects a semiconductor chip through metal bumps. In this case, there arises a problem that defective bonding of the semiconductor chip occurs due to defects of adhesive layers and bumps for bonding the semiconductor chip, and the reliability of the semiconductor package is degraded. Therefore, research is being conducted for improving the bonding performance of the adhesive layers and the bumps for bonding the semiconductor chip to improve the reliability of the semiconductor package.

SUMMARY

Aspects of the present disclosure provide a semiconductor device in which the bonding performance of an adhesive layer is improved by forming the adhesive layer with a double film, thereby improving the reliability of the bumps for bonding the semiconductor chip.

However, aspects of the present disclosure are not restricted to the one set forth above. The above and other aspects of the present disclosure will become more apparent to one of ordinary skill in the art to which the present disclosure pertains by referencing the detailed description of the present disclosure given below.

According to some embodiments of the present disclosure, there is provided a semiconductor package including a first structure, a first semiconductor chip on an upper surface of the first structure, a first conductive pad on the upper surface of the first structure between the upper surface of the first structure and the first semiconductor chip, a second conductive pad on a lower surface of the first semiconductor chip and vertically overlapping the first conductive pad, a bump connecting the first conductive pad and the second conductive pad, a first adhesive layer in contact with the upper surface of the first structure, the first adhesive layer surrounding at least a part of side walls of the bump and side walls of the first conductive pad, and a second adhesive layer in contact with an upper surface of the first adhesive layer and the lower surface of the first semiconductor chip, the second adhesive layer surrounding at least a part of the side walls of the bump and side walls of the second conductive pad, the second adhesive layer including a material different from the first adhesive layer, wherein a width of the first adhesive layer in a horizontal direction is smaller than a width of the second adhesive layer in the horizontal direction.

According to some embodiments of the present disclosure, there is provided a semiconductor package including a structure, a semiconductor chip on an upper surface of the structure, a first adhesive layer between the upper surface of the structure and a lower surface of the semiconductor chip, the first adhesive layer in contact with the upper surface of the structure, a second adhesive layer between an upper surface of the first adhesive layer and the lower surface of the semiconductor chip, the second adhesive layer in contact with each of the upper surface of the first adhesive layer and the lower surface of the semiconductor chip, the second adhesive layer including a material different from the first adhesive layer, a recess in the first adhesive layer, a first conductive pad inside the recess, the first conductive pad in contact with the upper surface of the structure, an upper surface of the first conductive pad is at a lower vertical layer than the upper surface of the first adhesive layer, a second conductive pad inside the second adhesive layer, the second conductive pad in contact with the lower surface of the semiconductor chip, and a bump connecting the first conductive pad and the second conductive pad, at least a part of the bump inside the recess, side walls of the bump being surrounded by each of the first adhesive layer and the second adhesive layer, wherein a width of the first adhesive layer in a horizontal direction is smaller than a width of the semiconductor chip in the horizontal direction.

According to some embodiments of the present disclosure, there is provided a semiconductor package including a structure, a semiconductor chip on an upper surface of the structure, a first conductive pad on the upper surface of the structure between the upper surface of the structure and the semiconductor chip, a second conductive pad on a lower surface of the semiconductor chip and vertically overlapping the first conductive pad, a bump connecting the first conductive pad and the second conductive pad, a first adhesive layer in contact with the upper surface of the structure, the first adhesive layer surrounding at least a portion of side walls of the bump and side walls of the first conductive pad, a second adhesive layer in contact with an upper surface of the first adhesive layer and the lower surface of the semiconductor chip, the second adhesive layer surrounding at least a portion of the side walls of the bump and side walls of the second conductive pads, the second adhesive layer including a material different from the first adhesive layer, and a molding layer on the upper surface of the structure and covering side walls of the first adhesive layer, side walls of the second adhesive layer, and side walls and an upper surface of the semiconductor chip, wherein a horizontal width of the semiconductor chip is smaller than a horizontal width of the second adhesive layer, wherein a horizontal width of the first adhesive layer is smaller than the horizontal width of the semiconductor chip, wherein an upper surface of the first conductive pad is at a lower vertical level than the upper surface of the first adhesive layer, and wherein at least a portion of the bump is in contact with the upper surface of the first adhesive layer.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

A semiconductor package according to some embodiments of the present disclosure now be described below with reference to FIGS. 1 to 3.

Figure 1:
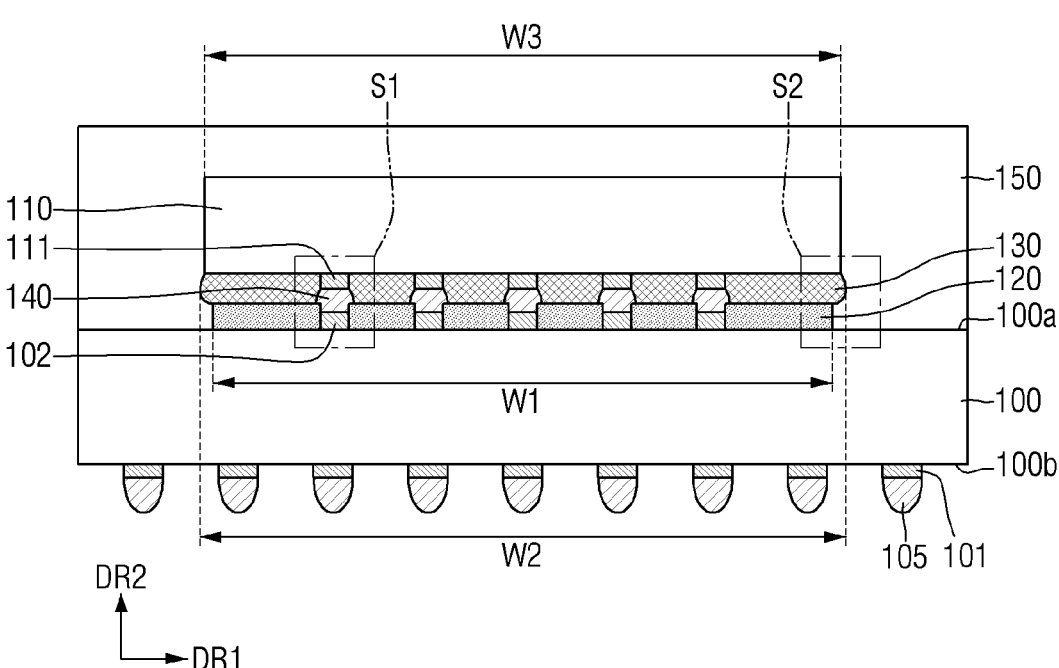
FIG. 1 is a diagram for explaining a semiconductor package according to some embodiments of the present disclosure.

FIG. 1 is a diagram for explaining a semiconductor package according to some embodiments of the present disclosure. FIG. 2 is an enlarged view of a region S1 of FIG. 1. FIG. 3 is an enlarged view of a region S2 of FIG. 1.

Figure 2:
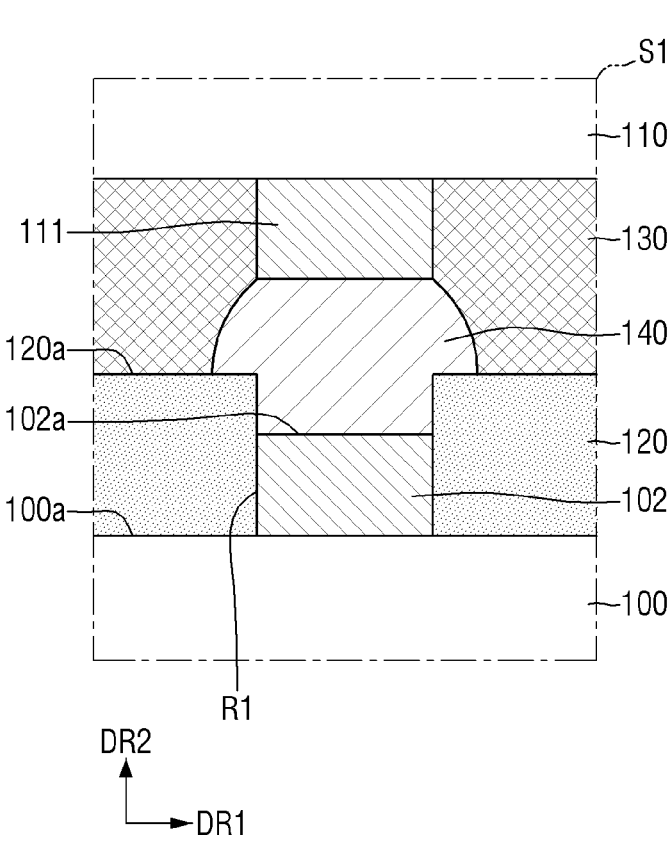
FIG. 2 is an enlarged view of a region S1 of FIG. 1.
Figure 3:
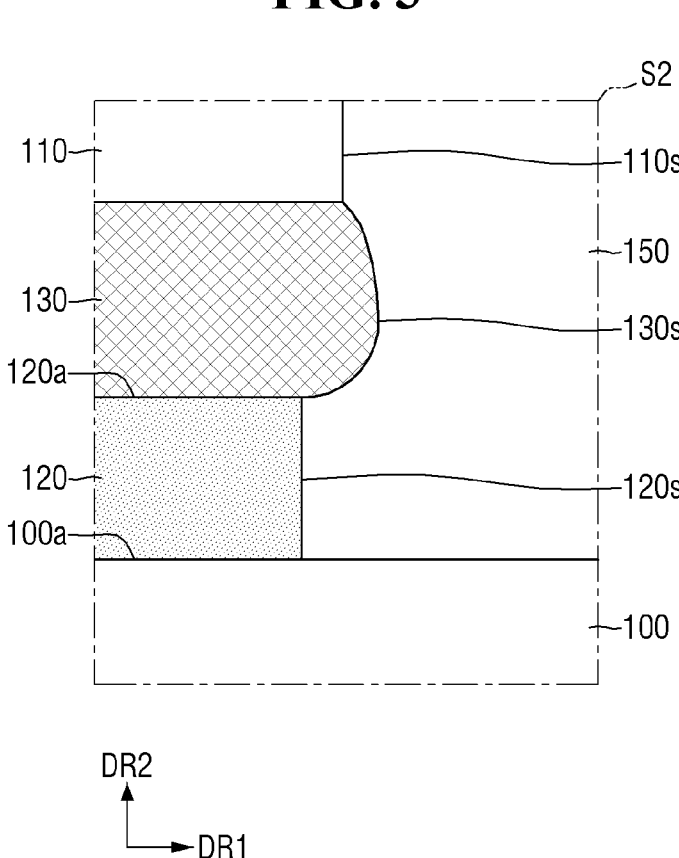
FIG. 3 is an enlarged view of a region S2 of FIG. 1.

Referring to FIGS. 1 to 3, a semiconductor package according to some embodiments of the present disclosure includes a first structure 100, a first conductive pad 101, a second conductive pad 102, a first bump 105, a first semiconductor chip 110, a third conductive pad 111, a first adhesive layer 120, a second adhesive layer 130, a second bump 140, and a molding layer 150.

The first structure 100 may include a lower surface 100b, and an upper surface 100a opposite to the lower surface 100b. The first structure 100 may be, for example, a printed circuit board (PCB) or a ceramic substrate. However, the present disclosure is not limited thereto.

When the first structure 100 is a printed circuit board, the first structure 100 may include at least one material selected from phenolic resin, epoxy resin, and polyimide. For example, the first structure 100 may include at least one material selected from FR4, tetrafunctional epoxy, polyphenylene ether, epoxy/polyphenylene oxide, BT (bismaleimide triazine), thermount, cyanate ester, polyimide, and liquid crystal polymer.

Hereinafter, a horizontal direction DR1 may be defined as a direction parallel to the upper surface 100a of the first structure 100. A vertical direction DR2 may be defined as a direction perpendicular to the horizontal direction DR1. That is, the vertical direction DR2 may be defined as a direction perpendicular to the upper surface 100a of the first structure 100.

A first conductive pad 101 may be disposed on the lower surface 100b of the first structure 100. The first conductive pad 101 may be in contact with the lower surface 100b of the first structure 100. For example, the first conductive pad 101 may protrude from the lower surface 100b of the first structure 100. However, the present disclosure is not limited thereto. In some other embodiments, at least a part of the first conductive pad 101 may be buried in the lower surface 100b of the first structure 100. The first conductive pad 101 may include a conductive material.

The second conductive pad 102 may be disposed on the upper surface 100a of the first structure 100. The second conductive pad 102 may be in contact with the upper surface 100a of the first structure 100. For example, the second conductive pad 102 may protrude from the upper surface 100a of the first structure 100. However, the present disclosure is not limited thereto. In some other embodiments, at least a part of the second conductive pad 102 may be buried in the upper surface 100a of the first structure 100. The second conductive pad 102 may include a conductive material.

The first bump 105 may be disposed on the lower surface 100b of the first structure 100. The first bump 105 may be connected to the first conductive pad 101. The first bump 105 may be a portion by which the first structure 100 is electrically connected to other external elements. Although the first bump 105 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof, the present disclosure is not limited thereto.

The first semiconductor chip 110 may be disposed on the upper surface 100a of the first structure 100. For example, the first semiconductor chip 110 may be a logic semiconductor chip. The first semiconductor chip 110 may be, for example, a micro-processor. The first semiconductor chip 110 may be, for example, a central processing unit (CPU), a controller, an application specific integrated circuit (ASIC) or the like.

For example, the first semiconductor chip 110 may include a plurality of stacked memory semiconductor chips. Each of the plurality of memory semiconductor chips may be, for example, a volatile memory semiconductor chip such as a DRAM (dynamic random access memory) or a SRAM (static random access memory), or a non-volatile memory semiconductor chip such as a PRAM (phase-change Random Access Memory), a MRAM (Magnetoresistive Random Access Memory), a FeRAM (Ferroelectric Random Access Memory) or a RRAM (Resistive Random Access Memory). However, the present disclosure is not limited thereto.

The third conductive pad 111 may be disposed on the lower surface of the first semiconductor chip 110. For example, the third conductive pad 111 may be in contact with the lower surface of the first semiconductor chip 110. The third conductive pad 111 may protrude from the lower surface of the first semiconductor chip 110. However, the present disclosure is not limited thereto. In some other embodiments, at least a part of the third conductive pad 111 may be buried in the lower surface of the first semiconductor chip 110. The third conductive pad 111 may be disposed to face the second conductive pad 102. That is, the third conductive pad 111 may overlap the second conductive pad 102 in the vertical direction DR2. The third conductive pad 111 may include a conductive material.

The second bump 140 may be disposed between the upper surface 100a of the first structure 100 and the lower surface of the first semiconductor chip 110. The second bump 140 may be disposed between the third conductive pad 111 and the second conductive pad 102. The second bump 140 may connect the third conductive pad 111 and the second conductive pad 102. Although the second bumps 140 may include, for example, at least one of tin (Sn), indium (In), lead (Pb), zinc (Zn), nickel (Ni), gold (Au), silver (Ag), copper (Cu), antimony (Sb), bismuth (Bi), and a combination thereof, the present disclosure is not limited thereto.

The first adhesive layer 120 may be disposed between the upper surface 100a of the first structure 100 and the lower surface of the first semiconductor chip 110. The first adhesive layer 120 may be in contact with the upper surface 100a of the first structure 100. For example, a width W1 of the first adhesive layer 120 in the horizontal direction DR1 may be smaller than a width W3 of the first semiconductor chip 110 in the horizontal direction DR1. For example, a side wall 110s of the first semiconductor chip 110 may protrude or extend in the horizontal direction DR1 more than a side wall 120s of the first adhesive layer 120.

The first adhesive layer 120 may surround the side walls of the second conductive pad 102. For example, a recess R1 may be formed inside the first adhesive layer 120 on the upper surface 100a of the first structure 100. The second conductive pad 102 may be disposed inside the recess R1 on the upper surface 100a of the first structure 100. For example, the upper surface 102a of the second conductive pad 102 may be formed to be lower or at a lower vertical level than the upper surface 120a of the first adhesive layer 120. That is, the second conductive pad 102 may partially fill the recess R1. The side wall of the second conductive pad 102 may be in contact with the first adhesive layer 120 inside the recess R1.

For example, at least a part of the second bump 140 may be disposed inside the recess R1. The second bump 140 may be in contact with the first adhesive layer 120 inside the recess R1. The second bump 140 may fill the remaining portion of the recess R1 on the second conductive pad 102. That is, the first adhesive layer 120 may partially surround the side walls of the second bumps 140. For example, the second bump 140 may have a shape that overflows in or extends on the horizontal direction DR1 on the upper surface 120a of the first adhesive layer 120. That is, at least a part of the second bump 140 may be in contact with the upper surface 120a of the first adhesive layer 120 adjacent to the recess R1.

The first adhesive layer 120 may include an insulating material. The first adhesive layer 120 may include, for example, polyimide or polybenzoxazole (PBO). However, the present disclosure is not limited thereto.

The second adhesive layer 130 may be disposed between the upper surface 120a of the first adhesive layer 120 and the lower surface of the first semiconductor chip 110. The second adhesive layer 130 may be in contact with each of the upper surface 120a of the first adhesive layer 120 and the lower surface of the first semiconductor chip 110. For example, the width W3 of the first semiconductor chip 110 in the horizontal direction DR1 may be smaller than the width W2 of the second adhesive layer 130 in the horizontal direction DR1. Also, the width W1 of the first adhesive layer 120 in the horizontal direction DR1 may be smaller than the width W2 of the second adhesive layer 130 in the horizontal direction DR1. For example, a side wall 130s of the second adhesive layer 130 may protrude or extend in the horizontal direction DR1 more than a side wall 110s of the first semiconductor chip 110. Moreover, the side walls 130s of the second adhesive layer 130 may protrude or extend in the horizontal direction DR1 more than a side wall 120s of the first adhesive layer 120. For example, the second adhesive layer 130 or the side walls 130s thereof may overhang the first adhesive layer 120 or the side walls 120s thereof.

The second adhesive layer 130 may surround the side walls of the third conductive pad 111. The second adhesive layer 130 may be in contact with the side walls of the third conductive pad 111. For example, the lower surface of the second adhesive layer 130 may be formed to be lower or at a lower vertical level than the lower surface of the third conductive pad 111. The second adhesive layer 130 may surround the remaining portions of the side walls of the second bump 140. That is, the side walls of the second bump 140 may be surrounded by the first adhesive layer 120 and the second adhesive layer 130. The second adhesive layer 130 may be in contact with the side walls of the second bump 140.

The second adhesive layer 130 may include an insulating material. The second adhesive layer 130 may include a different material from the first adhesive layer 120. The second adhesive layer 130 may include, for example, an insulating polymer material such as EMC (epoxy molding compound), but the present disclosure is not limited thereto.

The molding layer 150 may be disposed on the upper surface 100a of the first structure 100. The molding layer 150 may cover or be on each of the side walls 120s of the first adhesive layer 120, the side walls 130s of the second adhesive layer 130, and the side walls 110s and the upper surface of the first semiconductor chip 110. The molding layer 150 may be in contact with each of the side walls 120s of the first adhesive layer 120, the side walls 130s of the second adhesive layer 130, and the side walls 110s and the upper surface of the first semiconductor chip 110. For example, at least a part of the molding layer 150 may be disposed between the upper surface 100a of the first structure 100 and the second adhesive layer 130, on the side walls 120s of the first adhesive layer 120.

For example, the molding layer 150 may include a different material from that of each of the first adhesive layer 120 and the second adhesive layer 130. In some other embodiments, the molding layer 150 may include the same material as the second adhesive layer 130. The molding layer 150 may include, for example, an epoxy molding compound (EMC) or two or more kinds of silicon hybrid materials. However, the present disclosure is not limited thereto.

A method for fabricating the semiconductor package according to some embodiments of the present disclosure will be described below with reference to FIGS. 1 to 8.

FIGS. 4 to 8 are intermediate step diagrams for explaining the method for fabricating the semiconductor package according to some embodiments of the present disclosure.

Figure 4:
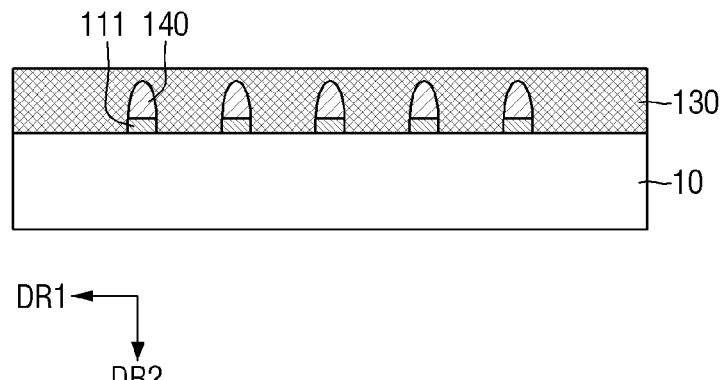
FIGS. 4 to 8 are intermediate step diagrams for explaining a method for fabricating the semiconductor package according to some embodiments of the present disclosure.

Referring to FIG. 4, a wafer 10 may be provided. Subsequently, a third conductive pad 111 and a second bump 140 may be sequentially formed on the wafer 10. The second bump 140 may be attached to the third conductive pad 111. A second adhesive layer 130 may then be formed to cover the third conductive pad 111 and the second bump 140 on the wafer 10.

Figure 5:
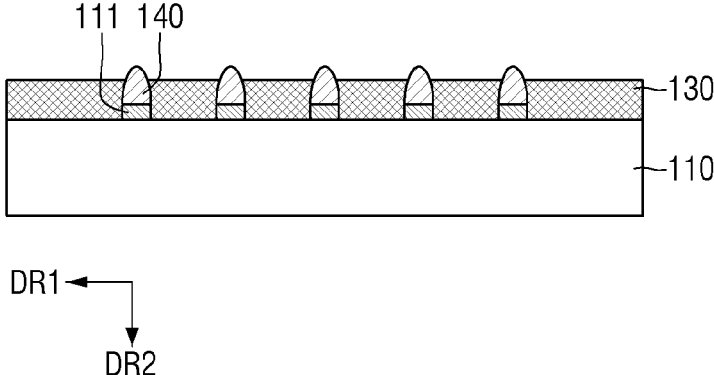

Referring to FIG. 5, the upper part of the second adhesive layer 130 may be partially etched to expose a part of the second bump 140. For example, the upper surface of the second adhesive layer 130 that remains after performing the etching process may be formed to be higher or at a higher vertical level than the upper surface of the third conductive pad 111. Subsequently, a sawing process may be performed on the wafer 10 to form the first semiconductor chip 110.

Figure 6:
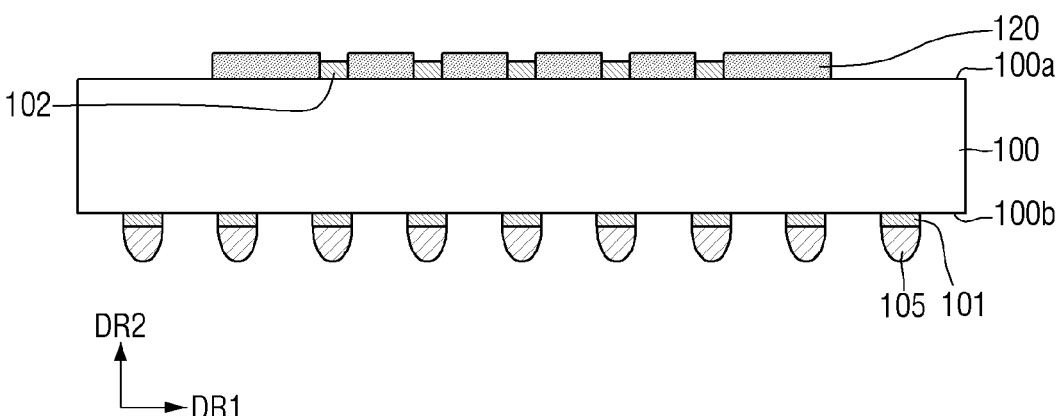

Referring to FIG. 6, a first structure 100 may be provided. Subsequently, a first conductive pad 101 and a first bump 105 may be sequentially formed on the lower surface 100b of the first structure 100. The first bump 105 may be attached to the first conductive pad 101.

Also, the first adhesive layer 120 may be formed on the upper surface 100a of the first structure 100. Subsequently, by partially etching the first adhesive layer 120, a recess (R1 of FIG. 2) may be formed inside the first adhesive layer 120. Subsequently, a second conductive pad 102 may be formed inside the recess (R1 of FIG. 2). The second conductive pad 102 may partially fill the inside of the recess (R1 of FIG. 2). That is, the upper surface of the second conductive pad 102 may be formed to be lower or at a lower vertical level than the upper surface of the first adhesive layer 120. After that, the first adhesive layer 120 may be cured through a curing process. That is, the hardness of the first adhesive layer 120 may be greater than the hardness of the second adhesive layer 130 of the state shown in FIG. 5.

Figure 7:
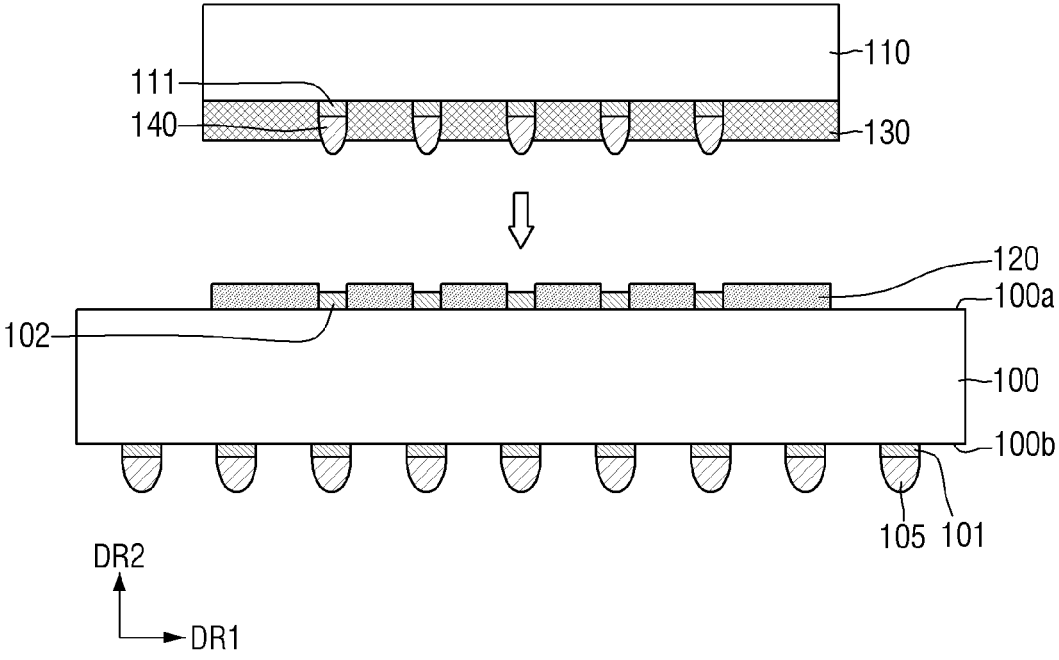

Referring to FIG. 7, the first semiconductor chip 110 may be bonded to the upper surface 100a of the first structure 100 in a state in which the first semiconductor chip 110 shown in FIG. 5 is turned upside down. For example, the second adhesive layer 130 may be bonded to the first adhesive layer 120. Also, a second bump 140 may be bonded to the second conductive pad 102.

In the process of bonding the second adhesive layer 130 to the first adhesive layer 120, the hardness of the first adhesive layer 120 may be greater than that of the second adhesive layer 130 because the curing process on the first adhesive layer 120 has already been performed. As a result, while the second adhesive layer 130 is bonded to the first adhesive layer 120, the shape of the first adhesive layer 120 is maintained, the second adhesive layer 130 is pressed, and only the side walls of the second adhesive layer 130 may be formed to protrude or extend in the horizontal direction DR1 more than the side wall of the first semiconductor chip 110.

Figure 8:
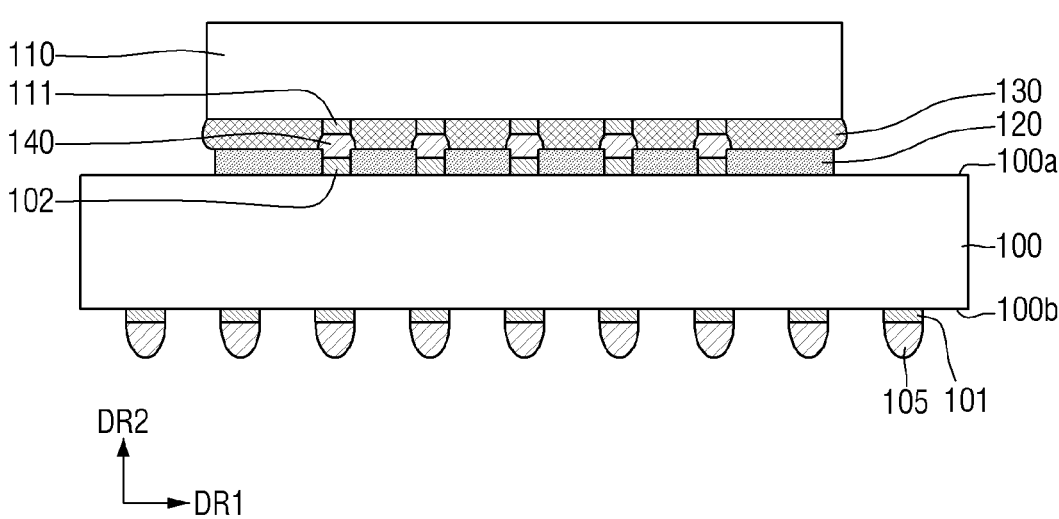

FIG. 8 shows a state in which the first semiconductor chip 110 is bonded onto the upper surface 100a of the first structure 100. For example, while the second adhesive layer 130 is being bonded to the first adhesive layer 120, the second adhesive layer 130 is thermally pressed, and at the same time, the side walls of the second adhesive layer 130 may protrude or extend in the horizontal direction DR1 more than the side walls of the first semiconductor chip 110. At least a part of the second bump 140 may be formed inside a recess (R1 of FIG. 2) formed in the first adhesive layer 120. That is, a part of the side wall of the second bump 140 may be in contact with the side wall of the first adhesive layer 120 inside the recess (R1 of FIG. 2). Subsequently, a curing process on the second adhesive layer 130 may be performed.

Referring to FIGS. 1 to 3, the molding layer 150 may be formed to cover each of the side wall 120s of the first adhesive layer 120, the side wall 130s of the second adhesive layer 130, and the side wall 110s and the upper surface of the first semiconductor chip 110, on the upper surface 100a of the first structure 100. The semiconductor package shown in FIGS. 1 to 3 may be fabricated through such a fabricating process.

In the method for fabricating the semiconductor package according to some embodiments of the present disclosure, the semiconductor chip 110 is bonded to the structure 100 using two adhesive layers 120 and 130, and at least a part of the bump 140 may be bonded to the second conductive pad 102 inside the recess R1 formed inside the first adhesive layer 120 that is the lower adhesive layer. In the process of bonding the second adhesive layer 130, which is the upper adhesive layer, to the first adhesive layer 120, the hardness of the first adhesive layer 120 may be greater than that of the second adhesive layer 130 because the curing process on the first adhesive layer 120 has been performed. While the second adhesive layer 130 is being bonded to the first adhesive layer 120, the shape of the first adhesive layer 120 with high hardness is maintained, and only the second adhesive layer 130 with low hardness may be pressed. That is, while the second adhesive layer 130 is being bonded to the first adhesive layer 120, only the second adhesive layer 130, which is a part of the adhesive layers surrounding the bump 140, has fluidity, an occurrence of defect of the bump 140 can be prevented.

In the semiconductor package according to some embodiments of the present disclosure fabricated by such a fabricating process, the side walls of the second adhesive layer 130 may protrude or extend in the horizontal direction DR1 more than each of the side walls of the first adhesive layer 120 and the side walls of the semiconductor chip 110. Further, in the semiconductor package according to some embodiments of the present disclosure fabricated by such a fabricating process, at least a part of the bump 140 may be surrounded by the first adhesive layer 120. That is, in the semiconductor package according to some embodiments of the present disclosure, the bonding performance of the adhesive layer is improved, and the reliability of the bumps 140 can be improved.

A semiconductor package according to some other embodiments of the present disclosure will be described below with reference to FIGS. 9 and 10. Differences from the semiconductor package shown in FIGS. 1 to 3 will be mainly explained in the interest of brevity.

Figure 9:
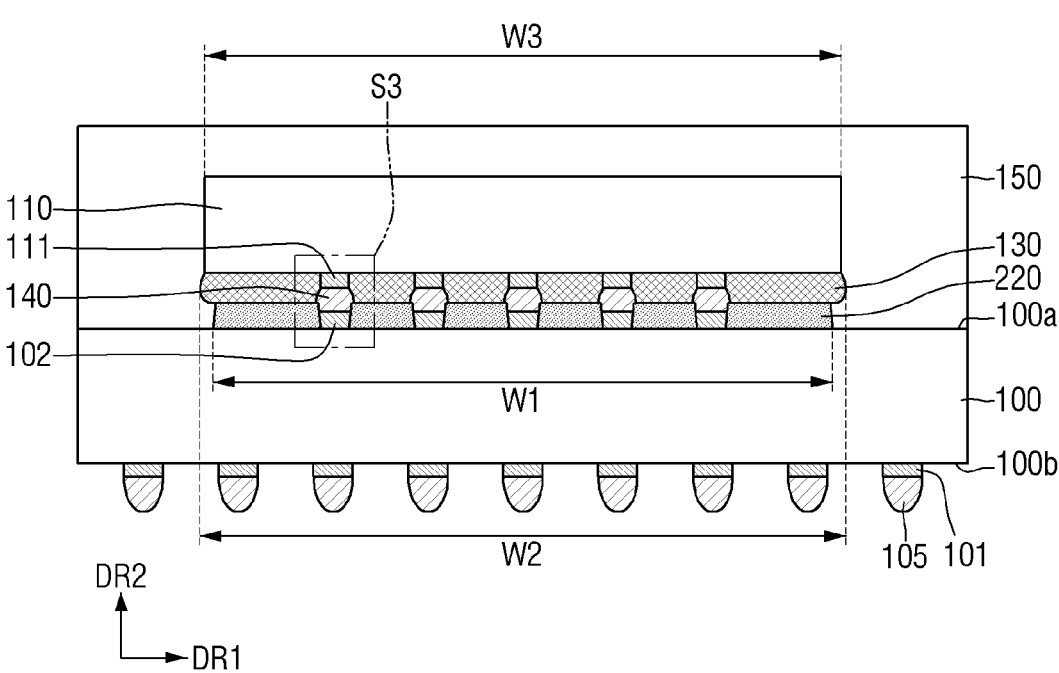
FIG. 9 is a diagram for explaining a semiconductor package according to some other embodiments of the present disclosure.

FIG. 9 is a diagram for explaining a semiconductor package according to some other embodiments of the present disclosure. FIG. 10 is an enlarged view of a region S3 of FIG. 9.

Figure 10:
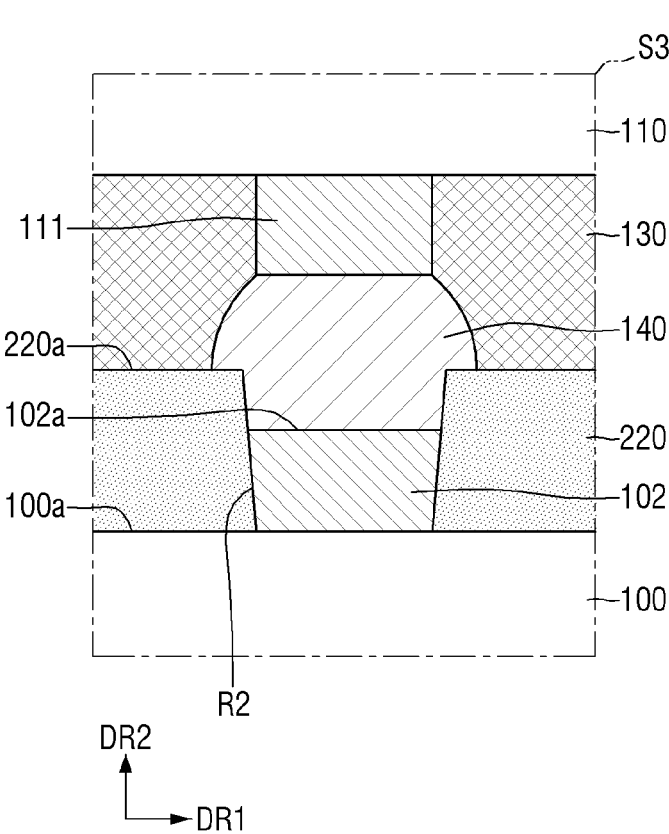
FIG. 10 is an enlarged view of a region S3 of FIG. 9.

Referring to FIGS. 9 and 10, in the semiconductor package according to some other embodiments of the present disclosure, side walls of a recess R2 formed inside a first adhesive layer 220 may have a sloped or inclined profile. For example, an obtuse angle may be defined between the sidewall of the recess R2 and the upper surface 100a of the first structure 100.

For example, the width of the recess R2 in the horizontal direction DR1 may decrease from the upper surface 220a of the first adhesive layer 220 toward the upper surface 100a of the first structure 100. In addition, the width in the horizontal direction DR1 of the second conductive pad 102 disposed inside the recess R2 may decrease from the upper surface 102a of the second conductive pad 102 toward the upper surface 100a of the first structure 100. The upper surface 102a of the second conductive pad 102 may be formed to be lower or at a lower vertical level than the upper surface 220a of the first adhesive layer 220. At least a part of the second bump 140 may be in contact with the upper surface 220a of the first adhesive layer 220 adjacent to the recess R2.

A semiconductor package according to some other embodiments of the present disclosure will be described below with reference to FIGS. 11 and 12. Differences from the semiconductor package shown in FIGS. 1 to 3 will be mainly explained in the interest of brevity.

Figure 11:
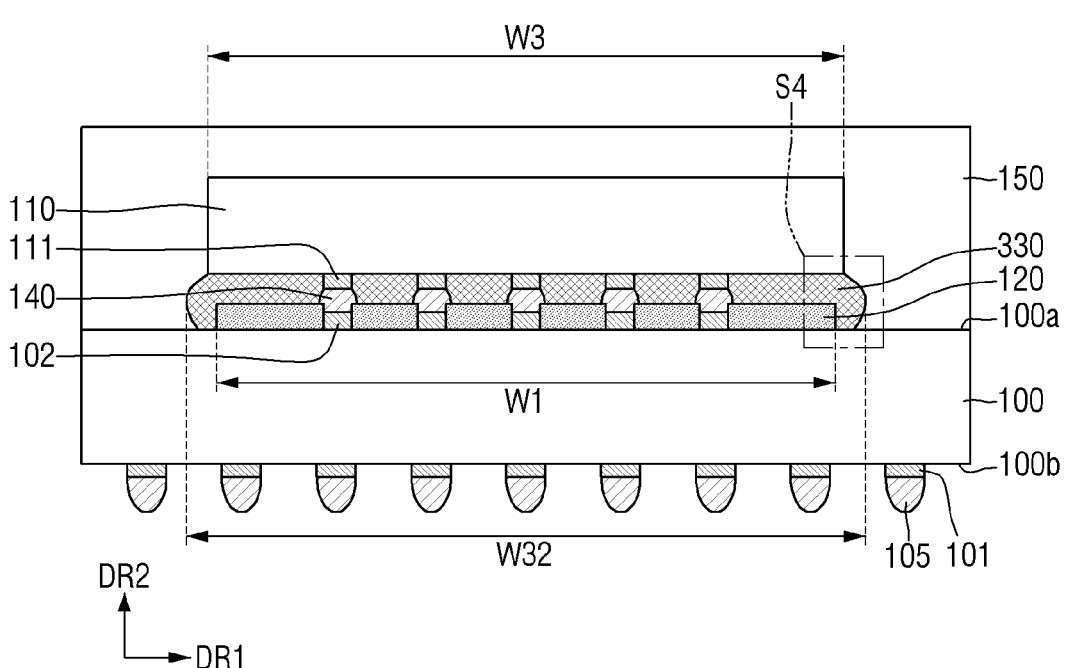
FIG. 11 is a diagram for explaining a semiconductor package according to some other embodiments of the present disclosure.

FIG. 11 is a diagram for explaining a semiconductor package according to some other embodiments of the present disclosure. FIG. 12 is an enlarged view of a region S4 of FIG. 11.

Figure 12:
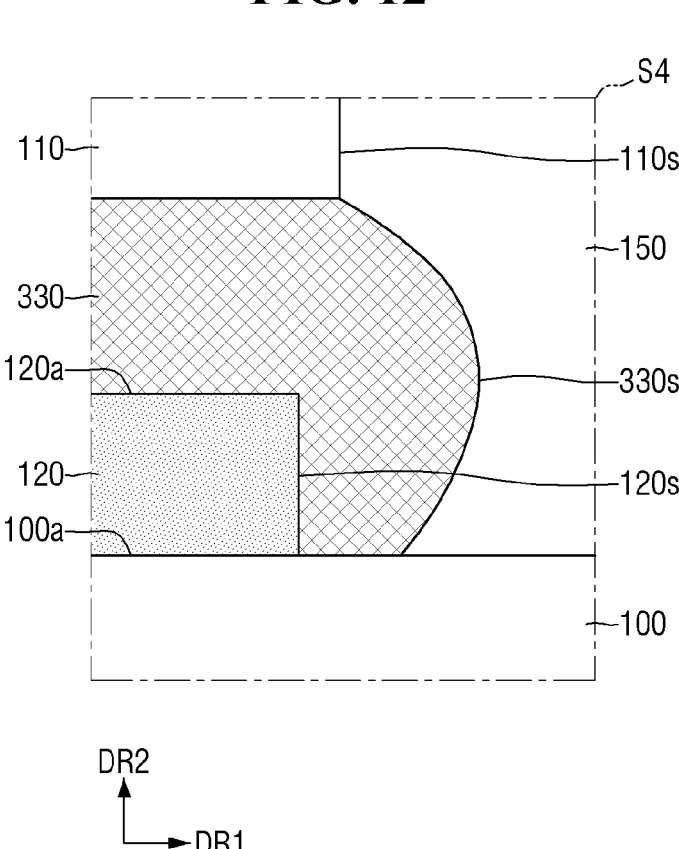
FIG. 12 is an enlarged view of a region S4 of FIG. 11.

Referring to FIGS. 11 and 12, in the semiconductor package according to some other embodiments of the present disclosure, a second adhesive layer 330 may cover the side walls 120s of the first adhesive layer 120.

For example, on the upper surface 100a of the first structure 100, the second adhesive layer 330 may overflow onto the side walls 120s of the first adhesive layer 120. The second adhesive layer 330 may be in contact with the side walls 120s of the first adhesive layer 120. In some embodiments, the second adhesive layer 330 may be in contact with the upper surface 100a of the first structure 100. However, the present disclosure is not limited thereto. In some other embodiments, the second adhesive layer 330 may be spaced apart from the upper surface 100a of the first structure 100.

For example, a width W3 of the first semiconductor chip 110 in the horizontal direction DR1 may be smaller than a width W32 of the second adhesive layer 330 in the horizontal direction DR1. Also, a width W1 of the first adhesive layer 120 in the horizontal direction DR1 may be smaller than the width W32 of the second adhesive layer 330 in the horizontal direction DR1. For example, the side wall 330s of the second adhesive layer 330 may protrude or extend in the horizontal direction DR1 more than the side wall 110s of the first semiconductor chip 110. Moreover, the side wall 330s of the second adhesive layer 330 may protrude or extend in the horizontal direction DR1 more than the side wall 120s of the first adhesive layer 120.

Hereinafter, a semiconductor package according to some other embodiments of the present disclosure will be described with reference to FIG. 13. Differences from the semiconductor package shown in FIGS. 1 to 3 will be mainly explained in the interest of brevity.

Figure 13:
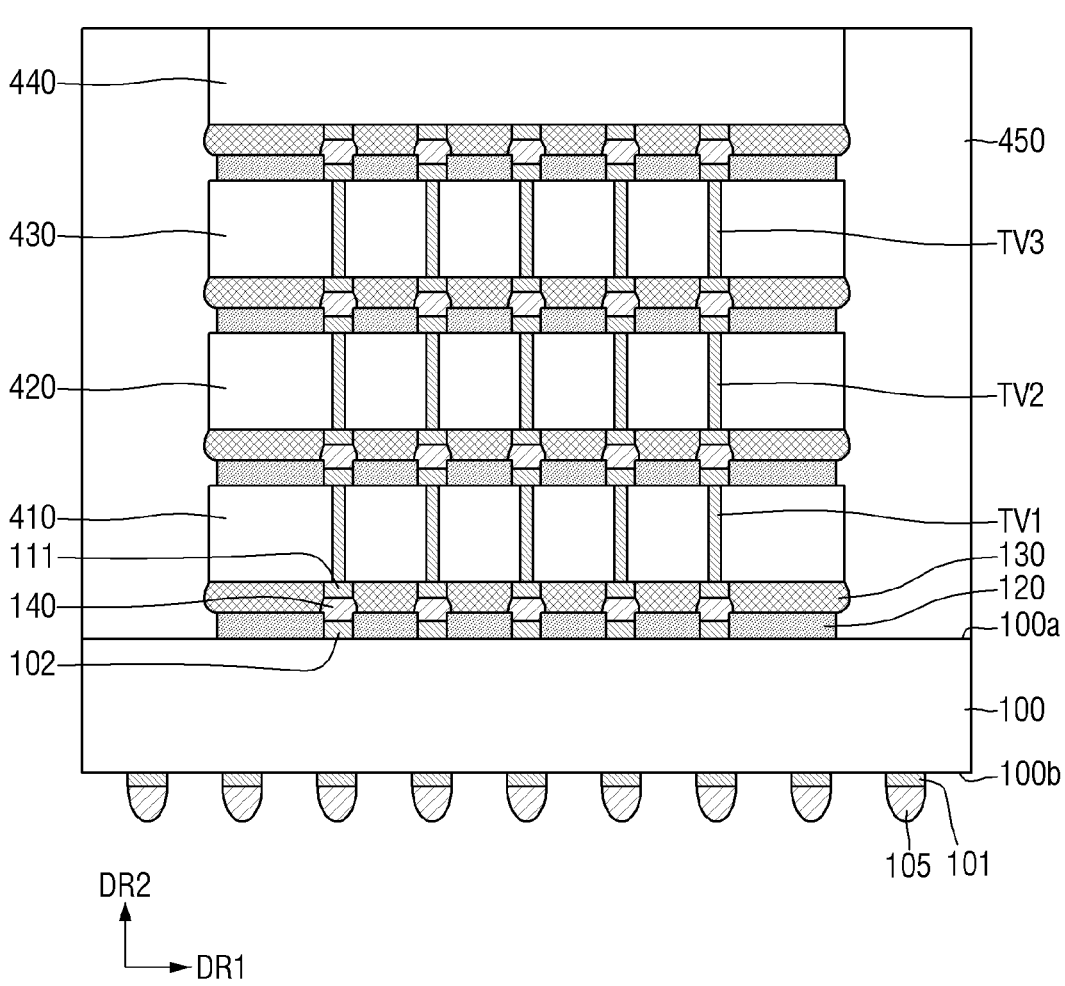
FIG. 13 is a diagram for explaining a semiconductor package according to some other embodiments of the present disclosure.

FIG. 13 is a diagram for explaining a semiconductor package according to some other embodiments of the present disclosure.

Referring to FIG. 13, a semiconductor package according to some other embodiments of the present disclosure may be a HBM (High Bandwidth Memory) semiconductor package including a plurality of memory semiconductor chips. For example, in the semiconductor package according to some other embodiments of the present disclosure, first to fourth semiconductor chips 410, 420, 430 and 440 may be sequentially stacked on the upper surface 100a of the first structure 100.

For example, the first structure 100 may be a buffer substrate. A first semiconductor chip 410 may be disposed on the upper surface 100a of the first structure 100. The first semiconductor chip 410 may be bonded onto the upper surface 100a of the first structure 100 through the first adhesive layer 120 and the second adhesive layer 130. The first semiconductor chip 410 may be electrically connected to the first structure 100 through the third conductive pad 111, the second bump 140 and the second conductive pad 102.

Each of the first adhesive layer 120, the second adhesive layer 130, the third conductive pad 111, the second bump 140 and the second conductive pad 102 shown in FIG. 13 may have the same structure as that of each of the first adhesive layer 120, the second adhesive layer 130, the third conductive pad 111, the second bump 140 and the second conductive pad 102 shown in FIG. 1. For example, each of the first adhesive layer 120, the second adhesive layer 130, the third conductive pad 111, the second bump 140 and the second conductive pad 102 may be disposed in the same structure, between the first structure 100 and the first semiconductor chip 410, between the first semiconductor chip 410 and the second semiconductor chip 420, between the second semiconductor chip 420 and a third semiconductor chip 430, and between the third semiconductor chip 430 and a fourth semiconductor chip 440, respectively.

For example, the second semiconductor chip 420 may be disposed on the upper surface of the first semiconductor chip 410. The second semiconductor chip 420 may be bonded onto the upper surface of the first semiconductor chip 410 through the first adhesive layer 120 and the second adhesive layer 130. The second semiconductor chip 420 may be electrically connected to the first semiconductor chip 410 through the third conductive pad 111, the second bump 140 and the second conductive pad 102.

The third semiconductor chip 430 may be disposed on the upper surface of the second semiconductor chip 420. The third semiconductor chip 430 may be bonded onto the upper surface of the second semiconductor chip 420 through the first adhesive layer 120 and the second adhesive layer 130. The third semiconductor chip 430 may be electrically connected to the second semiconductor chip 420 through the third conductive pad 111, the second bump 140 and the second conductive pad 102.

The fourth semiconductor chip 440 may be disposed on the upper surface of the third semiconductor chip 430. The fourth semiconductor chip 440 may be bonded onto the upper surface of the third semiconductor chip 430 through the first adhesive layer 120 and the second adhesive layer 130. The fourth semiconductor chip 440 may be electrically connected to the third semiconductor chip 430 through the third conductive pad 111, the second bump 140 and the second conductive pad 102. For example, each of the first to fourth semiconductor chips 410, 420, 430, and 440 may be a memory semiconductor chip. However, the present disclosure is not limited thereto. In some other embodiments, the fourth semiconductor chip 440 may be a dummy semiconductor chip.

A first through via TV1 may be disposed inside the first semiconductor chip 410. For example, the first through via TV1 may extend in the vertical direction DR2 inside the first semiconductor chip 410. A second through via TV2 may be disposed inside the second semiconductor chip 420. For example, the second through via TV2 may extend in the vertical direction DR2 inside the second semiconductor chip 420. A third through via TV3 may be disposed inside the third semiconductor chip 430. For example, the third through via TV3 may extend in the vertical direction DR2 inside the third semiconductor chip 430. Each of the first to third through vias TV1, TV2, and TV3 may include a conductive material.

The molding layer 450 may surround side walls of each of the first to fourth semiconductor chips 410, 420, 430 and 440 on the upper surface 100a of the first structure 100. Also, the molding layer 450 may surround the side walls of each of the first adhesive layer 120 and the second adhesive layer 130.

A semiconductor package according to still other embodiments of the present disclosure will be described below with reference to FIG. 14. Differences from the semiconductor package shown in FIGS. 1 to 3 will be mainly explained in the interest of brevity.

Figure 14:
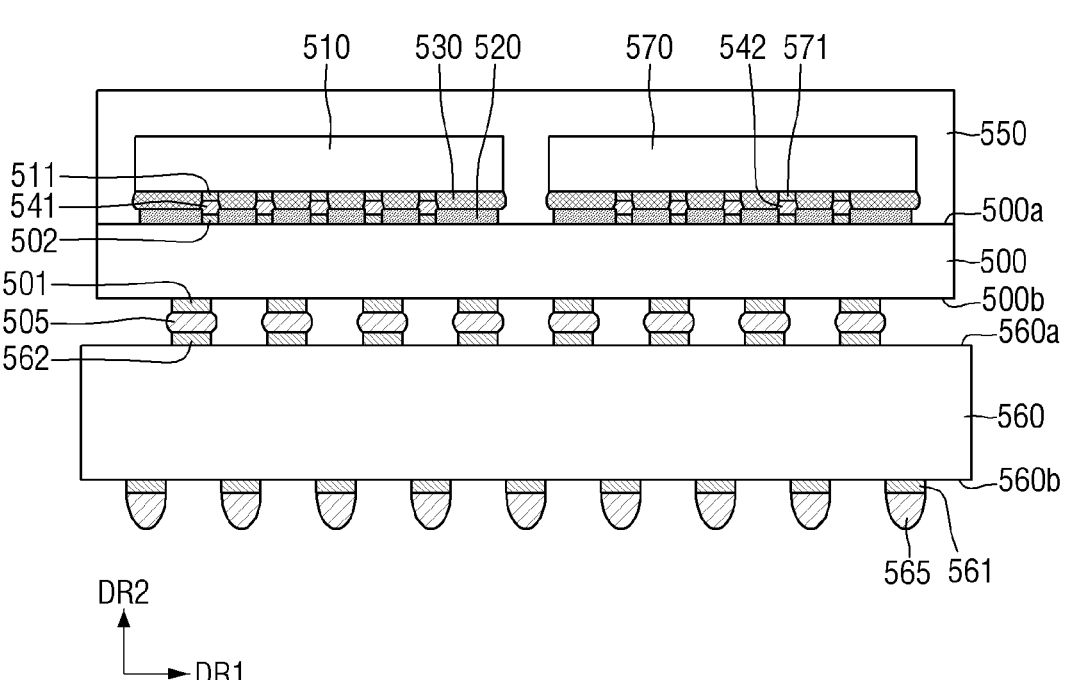
FIG. 14 is a diagram for explaining a semiconductor package according to some other embodiments of the present disclosure.

FIG. 14 is a diagram for explaining a semiconductor package according to some other embodiments of the present disclosure.

Referring to FIG. 14, a semiconductor package according to some other embodiments of the present disclosure may include a first structure 500, a first conductive pad 501, a second conductive pad 502, a first bump 505, a first semiconductor chip 510, a third conductive pad 511, a first adhesive layer 520, a second adhesive layer 530, a second bump 541, a second semiconductor chip 570, a fourth conductive pad 571, a third bump 542, a molding layer 550, a second structure 560, a fifth conductive pad 561, a sixth conductive pad 562, and a fourth bump 565.

For example, the first structure 500 may be an interposer. Each of the first semiconductor chip 510 and the second semiconductor chip 570 may be disposed on an upper surface 500a of the first structure 500. The second semiconductor chip 570 may be spaced apart from the first semiconductor chip 510 in the horizontal direction DR1. For example, each of the first semiconductor chip 510 and the second semiconductor chip 570 may be a logic semiconductor chip. Each of the first semiconductor chip 510 and the second semiconductor chip 570 may be, for example, a micro-processor. Each of the first semiconductor chip 510 and the second semiconductor chip 570 may be, for example, a central processing unit (CPU), a controller, an application specific integrated circuit semiconductor (ASIC), or the like.

For example, each of the first semiconductor chip 510 and the second semiconductor chip 570 may be an HBM semiconductor chip. For example, each of the first semiconductor chip 510 and the second semiconductor chip 570 may include a plurality of stacked memory semiconductor chips. Each of the plurality of memory semiconductor chips may be, for example, a volatile memory semiconductor chip such as a DRAM (Dynamic Random Access Memory) or a SRAM (Static Random Access Memory), or a non-volatile memory semiconductor chip such as a PRAM (Phasechange Random Access Memory), a MRAM (Magnetoresistive Random Access Memory), a FeRAM (Ferroelectric Random Access Memory) or a RRAM (Resistive Random Access Memory). However, the present disclosure is not limited thereto.

The first semiconductor chip 510 may be bonded onto the upper surface 500a of the first structure 500 through the first adhesive layer 520 and the second adhesive layer 530. The first semiconductor chip 510 may be electrically connected to the first structure 500 through the third conductive pad 511, the second bump 541 and the second conductive pad 502. Each of the first adhesive layer 520, the second adhesive layer 530, the third conductive pad 511, the second bump 541 and the second conductive pad 502 disposed between the upper surface 500a of the first structure 500 and the first semiconductor chip 510 may have the same structure as that of each of the first adhesive layer 120, the second adhesive layer 130, the third conductive pad 111, the second bump 140 and the second conductive pad 102 shown in FIG. 1.

The second semiconductor chip 570 may be bonded onto the upper surface 500a of the first structure 500 through the first adhesive layer 520 and the second adhesive layer 530. The second semiconductor chip 570 may be electrically connected to the first structure 500 through the fourth conductive pad 571, the third bump 542 and the second conductive pad 502. The second semiconductor chip 570 may be electrically connected to the first semiconductor chip 510 through the first structure 500. Each of the first adhesive layer 520, the second adhesive layer 530, the fourth conductive pad 571, the third bump 542, and the second conductive pad 502 disposed between the upper surface 500a of the first structure 500 and the second semiconductor chip 570 may have the same structure as that of each of the first adhesive layer 120, the second adhesive layer 130, the third conductive pad 111, the second bump 140 and the second conductive pad 102 shown in FIG. 1.

A molding layer 550 may at least partially cover each of the first semiconductor chip 510 and the second semiconductor chip 570 on the upper surface of the first structure 500. The second structure 560 may be disposed on the lower surface 500b of the first structure 500. The second structure 560 may be, for example, a printed circuit board (PCB) or a ceramic substrate. However, the present disclosure is not limited thereto. The first conductive pad 501 may be disposed on the lower surface 500b of the first structure 500. The fifth conductive pad 561 may be disposed on a lower surface 560b of the second structure 560. The sixth conductive pad 562 may be disposed on the upper surface 560a of the second structure 560.

The first bump 505 may be disposed between the sixth conductive pad 562 and the first conductive pad 501. The second structure 560 may be electrically connected to the first structure 500 through the sixth conductive pad 562, the first bump 505 and the first conductive pad 501. The fourth bump 565 may be disposed on the lower surface 560b of the second structure 560. The fourth bump 565 may be connected to the fifth conductive pad 561. The fourth bump 565 may be a portion by which the second structure 560 is electrically connected to other external elements.

A semiconductor package according to some other embodiments of the present disclosure will be described below with reference to FIG. 15. Differences from the semiconductor package shown in FIGS. 1 to 3 will be mainly explained in the interest of brevity.

Figure 15:
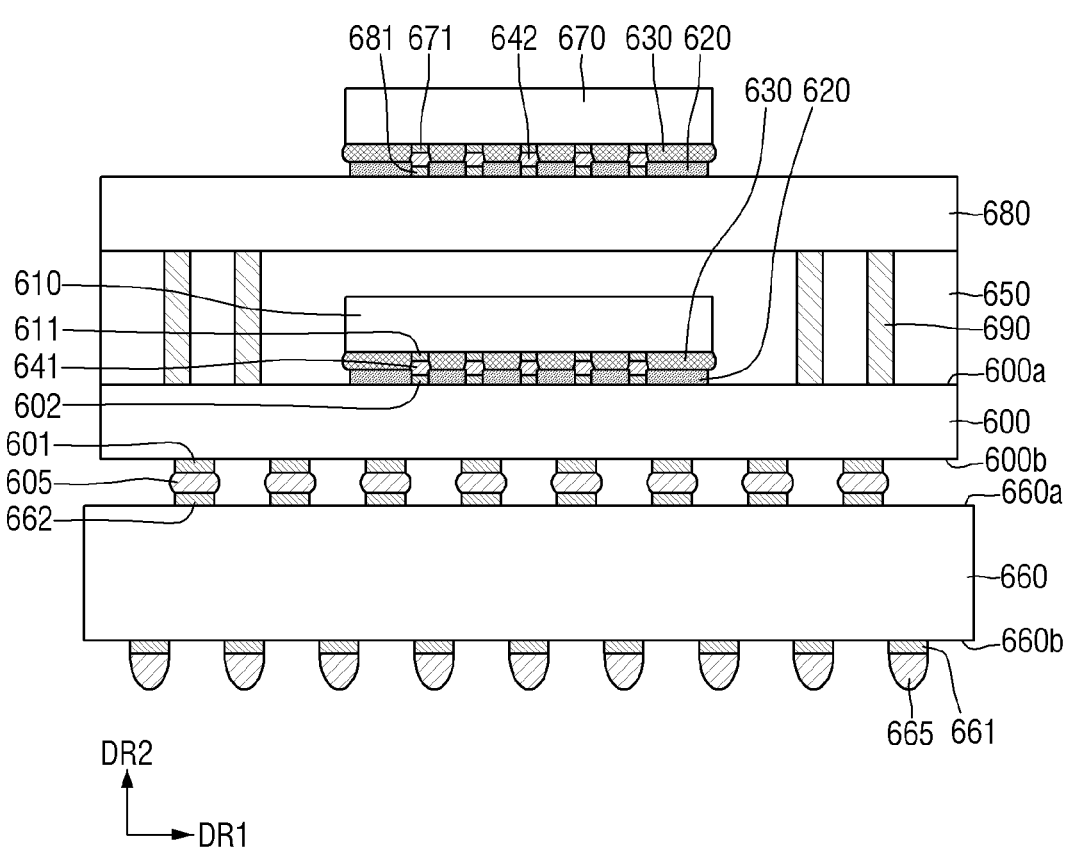
FIG. 15 is a diagram for explaining a semiconductor package according to some other embodiments of the present disclosure.

FIG. 15 is a diagram for explaining a semiconductor package according to some other embodiments of the present disclosure.

Referring to FIG. 15, a semiconductor package according to some other embodiments of the present disclosure may include a first structure 600, a first conductive pad 601, a second conductive pad 602, a first bump 605, a first semiconductor chip 610, a third conductive pad 611, a first adhesive layer 620, a second adhesive layer 630, a second bump 641, a second semiconductor chip 670, a fourth conductive pad 671, a third bump 642, a molding layer 650, a second structure 660, a fifth conductive pad 661, a sixth conductive pad 662, a fourth bump 665, a third structure 680, a seventh conductive pad 681 and a post 690.

For example, each of the first structure 600 and the third structure 680 may be a redistribution layer including a plurality of wirings. The first semiconductor chip 610 may be disposed on an upper surface 600a of the first structure 600. The second semiconductor chip 670 may be disposed on an upper surface of the third structure 680. For example, each of the first semiconductor chip 610 and the second semiconductor chip 670 may be a logic semiconductor chip. Each of the first semiconductor chip 610 and the second semiconductor chip 670 may be, for example, a microprocessor. Each of the first semiconductor chip 610 and the second semiconductor chip 670 may be, for example, a central processing unit (CPU), a controller, an application specific integrated circuit (ASIC), or the like.

For example, each of the first semiconductor chip 610 and the second semiconductor chip 670 may be an HBM semiconductor chip. For example, each of the first semiconductor chip 610 and the second semiconductor chip 670 may include a plurality of stacked memory semiconductor chips. Each of the plurality of memory semiconductor chips may be, for example, a volatile memory semiconductor chip such as a DRAM (Dynamic Random Access Memory) or a SRAM (Static Random Access Memory), or a non-volatile memory semiconductor chip such as a PRAM (Phasechange Random Access Memory), a MRAM (Magnetoresistive Random Access Memory), a FeRAM (Ferroelectric Random Access Memory) or a RRAM (Resistive Random Access Memory). However, the present disclosure is not limited thereto.

The first semiconductor chip 610 may be bonded onto the upper surface 600a of the first structure 600 through the first adhesive layer 620 and the second adhesive layer 630. The first semiconductor chip 610 may be electrically connected to the first structure 600 through the third conductive pad 611, the second bump 641 and the second conductive pad 602. Each of the first adhesive layer 620, the second adhesive layer 630, the third conductive pad 611, the second bump 641 and the second conductive pad 602 disposed

13 | 14 between the upper surface 600a of the first structure 600 and the first semiconductor chip 610 may have the same structure as that of each of the first adhesive layer 120, the second adhesive layer 130, the third conductive pad 111, the second bump 140 and the second conductive pad 102 shown in FIG. 1.

The molding layer 650 may be disposed between the upper surface 600a of the first structure 600 and the lower surface of the third structure 680. The molding layer 650 may cover or surround the side walls and the upper surface of the first semiconductor chip 610. The molding layer 650 may surround side walls of each of the first adhesive layer 620 and the second adhesive layer 630. A post 690 may penetrate or extend through the molding layer 650 on or adjacent the side wall of the first semiconductor chip 610 in the vertical direction DR2. The first structure 600 may be electrically connected to the third structure 680 through the post 690. The post 690 may include a conductive material.

The second semiconductor chip 670 may be bonded onto the upper surface of the third structure 680 through the first adhesive layer 620 and the second adhesive layer 630. The second semiconductor chip 670 may be electrically connected to the third structure 680 through the fourth conductive pad 671, the third bump 642 and the seventh conductive pad 681. The second semiconductor chip 670 may be electrically connected to the first semiconductor chip 610 through the third structure 680, the post 690 and the first structure 600. Each of the first adhesive layer 620, the second adhesive layer 630, the fourth conductive pad 671, the third bump 642 and the seventh conductive pad 681 disposed between the upper surface of the third structure 680 and the second semiconductor chip 670 may have the same structure as that of each of the first adhesive layer 120, the second adhesive layer 130, the third conductive pad 111, the second bump 140 and the second conductive pad 102 shown in FIG. 1.

The second structure 660 may be disposed on a lower surface 600b of the first structure 600. The second structure 660 may be, for example, a printed circuit board (PCB) or a ceramic substrate. However, the present disclosure is not limited thereto. The first conductive pad 601 may be disposed on the lower surface 600b of the first structure 600. The fifth conductive pad 661 may be disposed on the lower surface 660b of the second structure 660. The sixth conductive pad 662 may be disposed on the upper surface 660a of the second structure 660.

The first bump 605 may be disposed between the sixth conductive pad 662 and the first conductive pad 601. The second structure 660 may be electrically connected to the first structure 600 through the sixth conductive pad 662, the first bump 605 and the first conductive pad 601. The fourth bump 665 may be disposed on the lower surface 660b of the second structure 660. The fourth bump 665 may be connected to the fifth conductive pad 661. The fourth bump 665 may be a portion by which the second structure 660 is electrically connected to other external elements.

Although the embodiments of the present disclosure have been described above with reference to the accompanying drawings, the present disclosure is not limited to the above embodiments, and may be fabricated in various forms. Those skilled in the art will appreciate that the present disclosure may be embodied in other specific forms without changing the technical spirit or essential features of the present disclosure. Accordingly, the above-described embodiments should be understood in all respects as illustrative and not restrictive.

What is claimed is:

1. A semiconductor package comprising:
a first structure;
a first semiconductor chip on an upper surface of the first structure;
a first conductive pad on the upper surface of the first structure between the upper surface of the first structure and the first semiconductor chip;
a second conductive pad on a lower surface of the first semiconductor chip and vertically overlapping the first conductive pad;
a bump connecting the first conductive pad and the second conductive pad;
a first adhesive layer in contact with the upper surface of the first structure, the first adhesive layer surrounding at least a part of side walls of the bump and side walls of the first conductive pad; and
a second adhesive layer in contact with an upper surface of the first adhesive layer and the lower surface of the first semiconductor chip, the second adhesive layer surrounding at least a part of the side walls of the bump and side walls of the second conductive pad, the second adhesive layer including a material different from the first adhesive layer,
wherein a width of the first adhesive layer in a horizontal direction is smaller than a width of the second adhesive layer in the horizontal direction.

2. The semiconductor package of claim 1, wherein the width of the first adhesive layer in the horizontal direction is smaller than a width of the first semiconductor chip in the horizontal direction.

3. The semiconductor package of claim 1, wherein a width of the first semiconductor chip in the horizontal direction is smaller than the width of the second adhesive layer in the horizontal direction.

4. The semiconductor package of claim 1, wherein side walls of the second adhesive layer extend in the horizontal direction more than side walls of the first semiconductor chip.

5. The semiconductor package of claim 1, wherein side walls of the second adhesive layer extend in the horizontal direction more than side walls of the first adhesive layer.

6. The semiconductor package of claim 1, wherein an upper surface of the first conductive pad is at a lower vertical level than the upper surface of the first adhesive layer.

7. The semiconductor package of claim 1, wherein at least a part of the bump is in contact with the upper surface of the first adhesive layer.

8. The semiconductor package of claim 1, wherein the first structure is a printed circuit board.

9. The semiconductor package of claim 1, wherein the second adhesive layer is in contact with side walls of the first adhesive layer.

10. The semiconductor package of claim 1, further comprising:
a second semiconductor chip on the upper surface of the first semiconductor chip, the second semiconductor chip electrically connected to the first semiconductor chip;
a third semiconductor chip on an upper surface of the second semiconductor chip, the third semiconductor chip electrically connected to the second semiconductor chip;
a first through via extending in a vertical direction through the first semiconductor chip;
a second through via extending in the vertical direction through the second semiconductor chip; and a molding layer at least partially surrounding each of the first to third semiconductor chips on the upper surface of the first structure.

11. The semiconductor package of claim 1, further comprising:

a second semiconductor chip spaced apart from the first semiconductor chip in the horizontal direction on the upper surface of the first structure, the second semiconductor chip electrically connected to the first semiconductor chip through the first structure; and a second structure on a lower surface of the first structure, the second structure electrically connected to the first structure.

12. The semiconductor package of claim 1, further comprising:

a second structure on a lower surface of the first structure, the second structure electrically connected to the first structure;

a third structure on the upper surface of the first structure;

a post electrically connecting the first structure and the third structure; and a second semiconductor chip on an upper surface of the third structure, the second semiconductor chip electrically connected to the first semiconductor chip through the third structure, the post, and the first structure.

13. A semiconductor package comprising:

a structure;

a semiconductor chip on an upper surface of the structure;

a first adhesive layer between the upper surface of the structure and a lower surface of the semiconductor chip, the first adhesive layer in contact with the upper surface of the structure;

a second adhesive layer between an upper surface of the first adhesive layer and the lower surface of the semiconductor chip, the second adhesive layer in contact with each of the upper surface of the first adhesive layer and the lower surface of the semiconductor chip, the second adhesive layer including a material different from the first adhesive layer;

a recess in the first adhesive layer;

a first conductive pad inside the recess, the first conductive pad in contact with the upper surface of the structure, an upper surface of the first conductive pad is at a lower vertical level than the upper surface of the first adhesive layer;

a second conductive pad inside the second adhesive layer, the second conductive pad in contact with the lower surface of the semiconductor chip; and a bump connecting the first conductive pad and the second conductive pad, at least a part of the bump inside the recess, side walls of the bump being surrounded by each of the first adhesive layer and the second adhesive layer, wherein a width of the first adhesive layer in a horizontal direction is smaller than a width of the semiconductor chip in the horizontal direction.

14. The semiconductor package of claim 13, wherein the width of the first adhesive layer in the horizontal direction is smaller than a width of the second adhesive layer in the horizontal direction.

15. The semiconductor package of claim 13, wherein the width of the semiconductor chip in the horizontal direction is smaller than a width of the second adhesive layer in the horizontal direction.

16. The semiconductor package of claim 13, wherein at least a part of the bump is in contact with the upper surface of the first adhesive layer.

17. The semiconductor package of claim 13, wherein a width of the recess in the horizontal direction decreases from the upper surface of the first adhesive layer toward the upper surface of the structure.

18. The semiconductor package of claim 13, wherein at least a part of the second adhesive layer is in contact with the upper surface of the structure and on side walls of the first adhesive layer.

19. The semiconductor package of claim 13, further comprising:

a molding layer on side walls of the first adhesive layer, side walls of the second adhesive layer, and side walls and the upper surface of the semiconductor chip on the upper surface of the structure.

20. A semiconductor package comprising:

a structure;

a semiconductor chip on an upper surface of the structure;

a first conductive pad on the upper surface of the structure between the upper surface of the structure and the semiconductor chip;

a second conductive pad on a lower surface of the semiconductor chip and vertically overlapping the first conductive pad;

a bump connecting the first conductive pad and the second conductive pad;

a first adhesive layer in contact with the upper surface of the structure, the first adhesive layer surrounding at least a portion of side walls of the bump and side walls of the first conductive pad;

a second adhesive layer in contact with an upper surface of the first adhesive layer and the lower surface of the semiconductor chip, the second adhesive layer surrounding at least a portion of the side walls of the bump and side walls of the second conductive pads, the second adhesive layer including a material different from the first adhesive layer; and a molding layer on the upper surface of the structure and covering side walls of the first adhesive layer, side walls of the second adhesive layer, and side walls and an upper surface of the semiconductor chip, wherein a horizontal width of the semiconductor chip is smaller than a horizontal width of the second adhesive layer, wherein a horizontal width of the first adhesive layer is smaller than the horizontal width of the semiconductor chip, wherein an upper surface of the first conductive pad is at a lower vertical level than the upper surface of the first adhesive layer, and wherein at least a portion of the bump is in contact with the upper surface of the first adhesive layer.

* * * * *